(12) United States Patent
Steinberg et al.

(10) Patent No.: US 7,255,978 B2
(45) Date of Patent: Aug. 14, 2007

(54) MULTI-LEVEL OPTICAL STRUCTURE AND METHOD OF MANUFACTURE

(75) Inventors: Dan A. Steinberg, Blacksburg, VA (US); David W. Sherrer, Blacksburg, VA (US)

(73) Assignee: Shipley Company, L.L.C., Marlborough, MA (US)

(*) Notice: Subject to any disclaimer, the term of this patent is extended or adjusted under 35 U.S.C. 154(b) by 300 days.

(21) Appl. No.: 09/858,999

(22) Filed: May 16, 2001

(65) Prior Publication Data

US 2004/0091822 A9     May 13, 2004

Related U.S. Application Data

(63) Continuation-in-part of application No. 09/853,250, filed on May 9, 2001, now abandoned.

(60) Provisional application No. 60/257,021, filed on Dec. 20, 2000, provisional application No. 60/204,473, filed on May 16, 2000, provisional application No. 60/202,596, filed on May 9, 2000.

(51) Int. Cl.
*G03F 7/26* (2006.01)

(52) U.S. Cl. .................. 430/321; 430/323

(58) Field of Classification Search .......... 430/5, 430/321, 322, 323, 311, 313; 385/141–145; 216/25, 26; 427/163.2
See application file for complete search history.

(56) References Cited

U.S. PATENT DOCUMENTS

| | | | |
|---|---|---|---|
| 4,699,870 A * | 10/1987 | Iwadate et al. | 430/296 |
| 4,724,043 A * | 2/1988 | Bergendahl et al. | 216/2 |
| 4,837,129 A | 6/1989 | Frisch et al. | 430/319 |
| 5,001,038 A | 3/1991 | Dorinski et al. | 430/311 |
| 5,213,916 A | 5/1993 | Cronin et al. | 430/5 |
| 5,384,872 A | 1/1995 | Jacobs-Cook et al. | |
| 5,495,548 A * | 2/1996 | Bilodeau et al. | 385/123 |
| 5,547,788 A * | 8/1996 | Han et al. | 430/5 |
| 5,557,695 A * | 9/1996 | Yamane et al. | 385/49 |
| 5,631,109 A | 5/1997 | Ito | |
| 5,682,226 A * | 10/1997 | Anzai et al. | 355/53 |
| 5,784,509 A | 7/1998 | Yamane et al. | |
| 5,961,683 A | 10/1999 | Mizuta et al. | |
| 6,003,222 A * | 12/1999 | Barbarossa | 29/600 |
| 6,074,888 A * | 6/2000 | Tran et al. | 438/39 |
| 6,274,198 B1 | 8/2001 | Dautartas | |

FOREIGN PATENT DOCUMENTS

EP      0453753 A2    4/1990

* cited by examiner

*Primary Examiner*—Kathleen Duda
(74) *Attorney, Agent, or Firm*—Jonathan D. Baskin

(57) ABSTRACT

A multi-level optical device includes a substrate having a baseline level. At least one feature is disposed at a level above the baseline level. At least one feature is disposed at a level below the baseline level, or in the feature above the baseline level is located at a distance apart from the feature below the baseline level. The distance has an accuracy inn the range of approximately ±0.05 µm to less than approximately ±1.0 µm.

A method of fabricating an optical device includes forming at least one feature at a level of above a baseline level of a substrate; and forming at least one feature at a baseline level below the baseline level of the substrate, wherein the feature at a level above the baseline level and the feature at a level below the baseline level are patterned in a single-mask step using a multi-level mask.

30 Claims, 8 Drawing Sheets

MULTI-LEVEL OPTICAL STRUCTURE AND METHOD OF MANUFACTURE

CROSS-REFERENCES TO RELATED APPLICATIONS

The present invention is a continuation-in-part of U.S. patent application Ser. No. 09/853,250, entitled "Multi-Level Lithography Masks", filed May 9, 2001 now abandoned, which in turn claims the benefit of the following U.S. Provisional Patent Applications: Ser. No. 60/202,596, entitled "Multilevel Contact Mask For Patterning Multilevel Substrates", filed May 9, 2000; Ser. No. 60/204,473, entitled "Single Mask Process for Patterning Integrated Optic Waveguides, Metallizations And Micromachined Features", filed May 16, 2000, and Ser. No. 60/257,021, entitled "Alternative Embodiment For Making The Multilevel Contact Mask", filed Dec. 20, 2000. The disclosures of the above captioned patent application and provisional applications are specifically incorporated by reference in their entirety and for all purposes herein.

FIELD OF THE INVENTION

The present invention relates generally to optical integrated circuits and optical benches. More particularly, the present invention relates to multi-level optical integrated circuits (OIC's) and optical benches.

BACKGROUND OF THE INVENTION

OIC and optical bench fabrication often involves transferring patterns to a substrate. These patterns may be used to form a variety of structures to include conductive circuit lines, planar waveguides, mesas and recesses. Typically, the desired structures are formed using lithography. Lithography may be achieved by techniques such as photolithography, x-ray lithography and e-beam lithography.

In photolithography, for example, a layer of photo-reactive film, known as photoresist, may be formed over the substrate. A photolithographic mask containing the image of a desired pattern is then placed in contact with the photoresist film. Radiation of a wavelength to which the photoresist is sensitive is incident upon the mask. The radiation passes through the transparent areas of the mask and the exposed areas of the photoresist are reactive to the radiation. The photoresist film is then chemically developed, leaving behind a pattern of photoresist substantially identical to the pattern on the mask.

The patterned photoresist on the substrate may be used in a variety of applications to form the structures referenced above. For example, a pattern photoresist may act as a mask for selective etching of a substrate. This selective etching may be used to fabricate recesses and as mesas in the substrate. In OIC and optical bench technologies, the mesas and recesses may be used for a variety of purposes, including passive alignment of optical elements.

The above described photolithographic process is often referred to as contact printing, because the mask is placed in contact with the substrate. Contact printing has facilitated the fabrication of highly integrated structures in both electrical and optical integrated circuits. However, conventional contact printing techniques have certain limitations. For example, conventional contact printing techniques generally are useful only in processing flat substrates. If a substrate has a relief (i.e. has a non-planar topography) it is exceedingly difficult to fabricate structures on the substrate by flat conventional contact printing techniques. To this end, conventional photolithographic masks are substantially flat. As a result, it is exceedingly difficult to place the mask in contact with, or in close enough proximity to, all points on the surface of a substrate to enable accurate image projection onto the substrate. In regions of the substrate where the photolithographic mask is not in contact with, or in close enough proximity to, the substrate, diffractive effects result in poor resolution and ultimately a poor transfer of the pattern from the mask to the photoresist.

The above referenced limitations of image lithography processing typically result in inaccurate location and spacing of features in a multi-level substrate. These inaccuracies are unacceptable as the integration of various elements at multiple levels in OIC's and optical bench technologies gains industry acceptance. Accordingly, what is needed are optical integrated circuits and optical benches which incorporate a variety of features at multiple levels which overcome the inaccuracies of conventional structures and methods of manufacture as referenced above.

SUMMARY OF THE INVENTION

According to an exemplary embodiment of the present invention, a multi-level optical device includes a substrate having a baseline level. At least one feature is disposed at a level above the baseline level. At least one feature is disposed at a level below the baseline level, wherein the feature above the baseline level is located at a horizontal distance apart from the feature below the baseline level. The horizontal distance has an accuracy of approximately ±0.05 μm to approximately less than ±1.0 μm.

According to an another exemplary embodiment of the present invention, a method of fabricating an optical device includes forming at least one feature at a level of above a baseline level of a substrate; and forming at least one feature at a level below the baseline level of the substrate, where the feature at a level above the baseline level and the feature at a level below the baseline level are patterned in a single-mask step using a multi-level mask.

DEFINED TERMS

As used herein, "non-planar" means having multiple levels or regions above and/or below a principal planar surface (baseline level) of a substrate.

As used herein, "opaque" means electromagnetic radiation of a particular wavelength or wavelength spectrum is substantially absorbed and/or substantially reflected, so that blocked radiation does not expose radiation sensitive layer(s) during lithography.

As used herein, "transparent" means electromagnetic radiation of a particular wavelength or wavelength spectrum is neither substantially absorbed nor substantially reflected, so that transmitted radiation can be used to expose a radiation sensitive layer(s) during lithography.

As used herein, the term "close proximity" means close enough to an object that diffractive effects are substantially negligible.

BRIEF DESCRIPTION OF THE DRAWINGS

The invention is best understood from the following detailed description when read with the accompanying drawing figures. It is emphasized that the various features are not necessarily drawn to scale. In fact, the dimensions may be arbitrarily increased or decreased for clarity of discussion.

DETAILED DESCRIPTION

In the following detailed description, for purposes of explanation and not limitation, exemplary embodiments disclosing specific details are set forth in order to provide a thorough understanding of the present invention. However, it will be apparent to one having ordinary skill in the art having had the benefit of the present disclosure, that the present invention may be practiced in other embodiments that depart from the specific details disclosed herein. Moreover, descriptions of well-known devices, methods and materials may be omitted so as to not obscure the description of the present invention.

For the purpose of clarity of discussion, the description of the illustrative embodiments described below will center primarily on ultraviolet (UV) photolithography, where UV light is used for photoresist patterning. Therefore, unless otherwise specified, the materials and structural dimensions are specific to UV photolithography. Of course, the present invention may be used in other lithographic techniques. These include, but are not limited to, lithography using other electromagnetic radiation. Illustratively, photolithography using other portions of the optical spectrum and x-ray lithography may be used. As disclosed fully in the parent application, the multi-level mask have materials and dimensions specific to the chosen lithography technique. In addition, the materials and dimensions used for the various elements used to form the multi-level structure of the invention of the present disclosure may be different than those disclosed herein, which are illustrative of those used in UV-photolithography. Again, these materials and dimensions are chosen for the specific type of lithography used. Finally, in addition to the lithography specific transparent properties, opaque properties and radiation sensitivity properties, these materials may have to exhibit etch-selectivity to enable fabrication of various features. These materials and dimensions within the purview of one having ordinary skill in the art.

Figure 1:
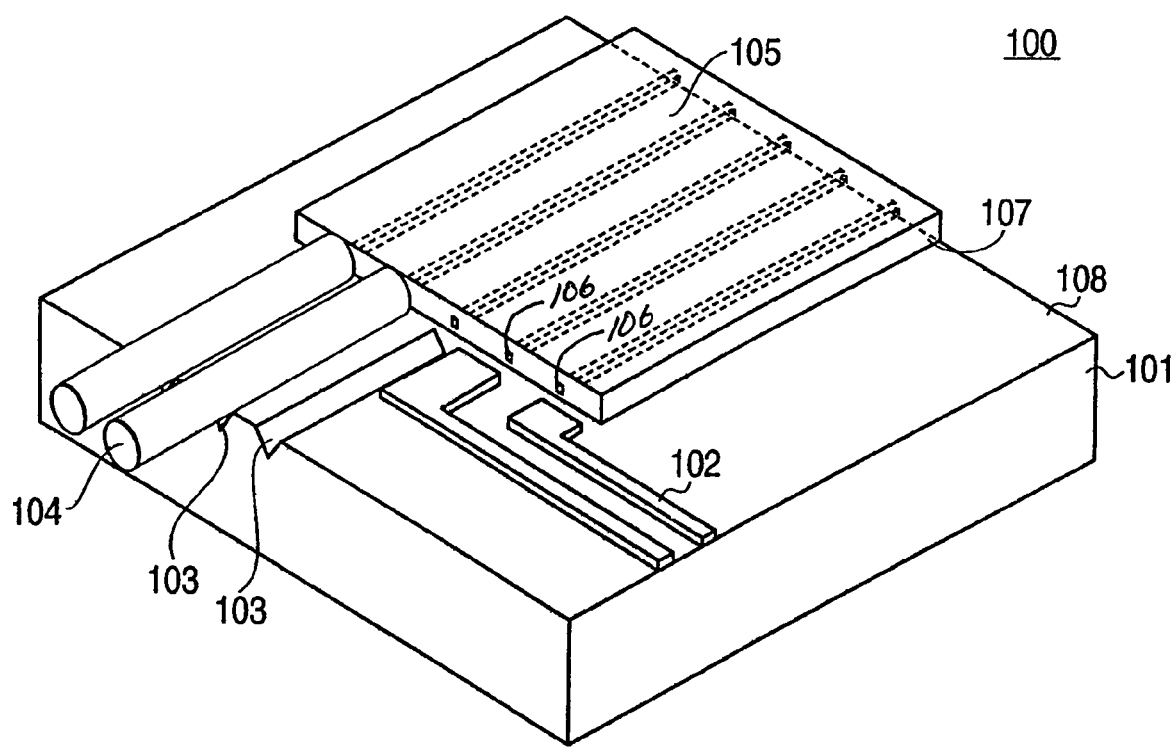
FIG. 1 is a perspective view of a structure in accordance with an exemplary embodiment of the present invention.

FIG. 1 is a perspective view of structure 100 in accordance with an exemplary embodiment of the present invention. Illustratively, structure 100 is a portion of an optical integrated circuit, or a portion of an optical bench. The structure 100 includes a substrate 101. The substrate 101 is illustratively silicon or other suitable material. Conductive elements 102 may be disposed over the substrate 101. The conductive elements 102 may be used for bonding of an optoelectronic device such as a laser or photodetector (not shown). Moreover, the conductive elements 102 may be useful in providing electrical connection between an optoelectronic device and electronic devices (not shown) of an OIC.

Illustratively, conductive elements 102 are metal. Grooves 103, which are illustratively v-shaped grooves are formed in the substrate 101. The grooves 103 are illustratively used to hold optical fibers 104. The grooves are accurately located and have accurate dimensions, which enables accurate alignment of the optical fibers 104 to optical waveguides of the OIC. Of course, this is merely illustrative, and the optical fibers could be coupled to an optoelectronic device (not shown) such as laser, light emitting diode (LED) or photodetector. Moreover, grooves 103 are illustrative of a variety of recesses which may be formed in substrate 101. These recesses may also be for example, inverted pyramidal-shaped pits for holding spherical elements, such as microlenses.

Planar waveguides 105, having waveguide cores 106 and cladding layer 107 disposed thereabout, are coupled to the optical fibers in an accurate manner by virtue of the accurate location of the planar waveguides 105 and the optical fibers 104. To this end, the planar waveguides 105 are fabricated above baseline level 108 of substrate 101, whereas the grooves 103 are fabricated below the baseline level 108 of the substrate 101. As explained in further detail herein, the grooves 103 and the waveguide cores 106 may be defined in a single-mask step using a multi-level mask by virtue of the fabrication sequence according to an illustrative embodiment of the present invention.

This single-mask step enables accurate location of the grooves 103 relative to the waveguide cores 106, which facilitates accurate optical coupling between an optical fiber communication system and a terminal interface such as structure 101 which may be an OIC or an optical bench. Moreover, the conductive elements 102 may also be accurately located and fabricated according to an illustrative embodiment of the present invention. The accurate location of the conductive elements relative to planar waveguides 105 fosters accurate optical coupling between an optoelectronic device disposed over conductive elements 102 and planar optical waveguides 105, for example. As will be described in further detail herein, the accuracy of the horizontal distance between the features formed at different levels of structure 100 is in the range of approximately ±0.05 µm to less than approximately ±1.0 µm.

It is of interest to note that other devices beside the planar waveguides 105 could be coupled to optical fibers 104. For example, the optical fibers 104 could be optically coupled to an optoelectronic device (not shown), which is disposed at a level above baseline level 108. In this exemplary embodiment, the single mask step, using the multi-level mask described in the above referenced parent application, enables the formation of conductive pads (such as conductive elements 102) to be accurately located and accurately spaced from grooves 103. As such, the tolerance of the horizontal distance between features (e.g. conductive pads and grooves) at different level is in the range of approximately ±0.05 µm to approximately less than ±1.0 µm . Ultimately, this fosters accurate coupling between the optical fiber(s) and the optoelectronic device.

Finally, it is of interest to note that other elements may be formed over the substrate at levels above the baseline level 108 or be disposed in recesses formed below the baseline level. These include passive optical devices such as filters, gratings, isolators, multiplexers, as well as others within the purview of one having ordinary skill in the art.

Figure 2:
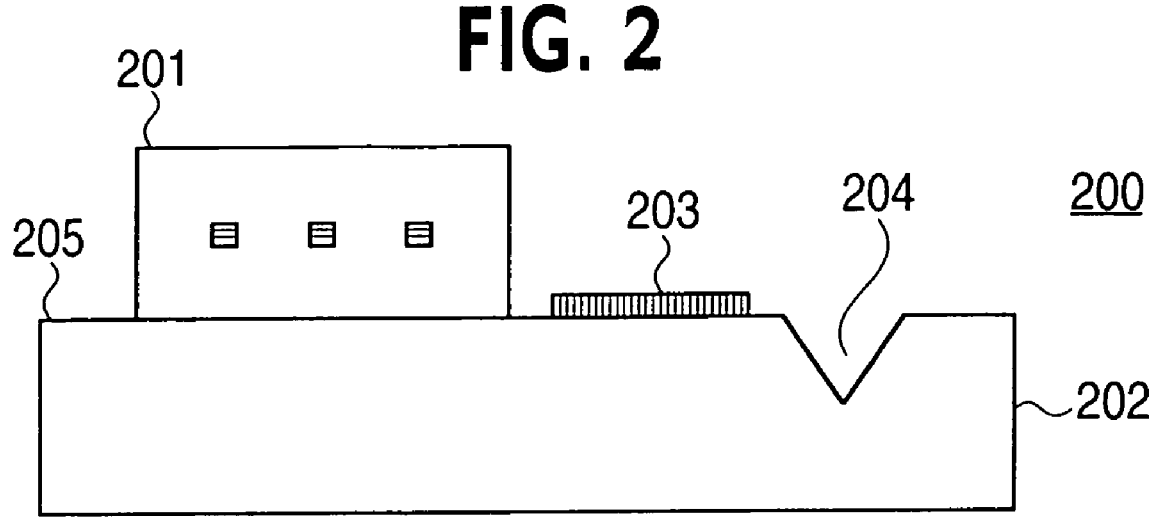
FIG. 2 is cross-section view of a structure in accordance with an exemplary embodiment of the present invention.

FIG. 2 shows a cross-sectional view of a structure 200 having planar waveguides 201 above a baseline level 205 of a substrate 202. Conductive elements 203 are disposed above baseline level 205, but at a different level than planar waveguides 201. Finally, a recess 204 is disposed below baseline level 205 of substrate 202. As can be readily appreciated, planar waveguides 201, conductive elements 203 and recess 204 may be elements of structure 100 shown in FIG. 1. An illustrative technique for fabricating a structure, such as structure 200 is described presently. As discussed above, as well as discussed in the above captioned parent application, the illustrative fabrication sequence centers on photolithography, particularly UV photolithography. Of course, this is merely illustrative, and is in no way limiting of the present invention.

Figure 3A:
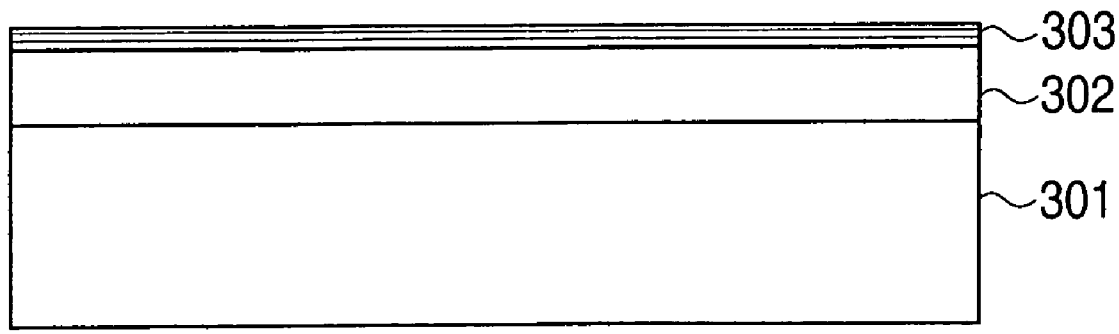
FIGS. 3(*a*)-3(*k*) are cross-sectional views of an illustrative fabrication sequence in accordance with an exemplary embodiment of the present invention.

FIG. 3(a) is a cross-sectional view of a substrate 301 having a lower cladding layer 302 disposed thereover. A core layer 303 is disposed over the lower cladding layer 302. In the illustrative embodiment shown in FIG. 3(a), the substrate 301 is illustratively silicon. The lower cladding layer 302 may be silica, silicon oxynitride, glass or a doped material such as doped glass. The core layer 303 may be silica, silicon oxynitride, glass, doped material (e.g. doped glass), silicon, GaAs, InP or polymer. Of course, these are merely illustrative, and alternative materials may be used for a variety of applications in keeping with the present invention. The lower cladding layer 302 and core layer 303 have accurately determined thicknesses. Illustratively, the core layer 303 has a thickness in the range of approximately 2 µm to approximately 5 µm. The lower cladding layer 302 has a thickness in the range of approximately 10 µm to approximately 20 µm. The lower cladding layer 302 and core layer 303 may be fabricated of a variety of materials.

Figure 3B:
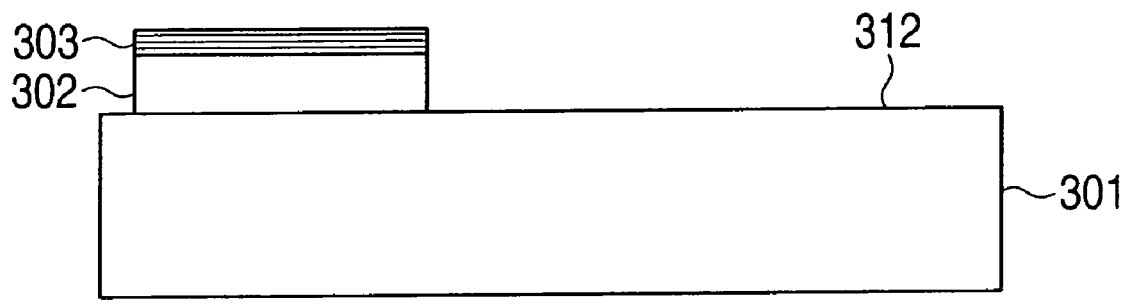

FIG. 3(b) shows a portion of lower cladding layer 302 and core layer 303 having been selectively removed from the top surface of substrate 301. This removal may be done relatively inaccurately, and by standard etching techniques.

Figure 3C:
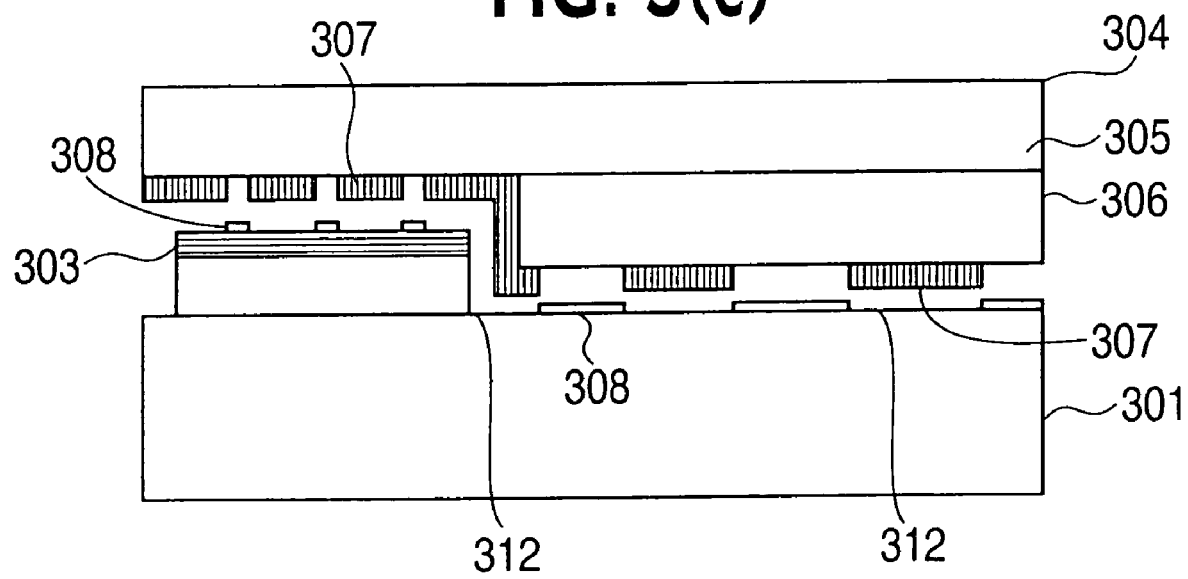

FIG. 3(c) shows a multi-level mask 304 disposed over substrate 301 and over the core layer 303. The multi-level mask 304 is illustratively a two-level mask having a base layer 305 and a mesa 306, which are transparent. The mask further includes opaque portions 307 used during an image lithography step. Further details of multi-level mask 304 may be found in the above captioned parent application. In the illustrative embodiment shown in FIG. 3(c), the multi-level mask 304 is useful in patterning conductive elements 308 over the core layer 303 and substrate 301. The conductive elements 308 over core layer 303 are at a level above baseline level 312 of substrate 301, while conductive elements 308 over substrate 301 are at another level above baseline level 312. The conductive elements 308 are illustratively metal, such as chromium. The conductive elements 308 may be patterned using standard lift-off techniques or undercut etch techniques well known to one having ordinary skill in the art.

Conductive elements 308 may be used as masks during selective etching to form features useful in OIC and optical bench applications. Moreover, conductive elements 308 may be used as mounting pads for optoelectronic devices as well as to provide electrical connections between optoelectronic devices and electronic devices on an OIC. Finally, the accuracy of the formation of the conductive elements 308 is due to the single-mask step at multiple levels enabled by multi-level mask 304. Because the conductive elements 308 are accurately located and accurately spaced apart, etched features formed using conductive elements 308 as masks are accurately located and spaced. The accuracy of the horizontal distance between these etched features is in the range of approximately ±0.05 µm to less than approximately ±1.0 µm. Further details of this accurate spacing and location of features are described herein and in the above captioned parent application.

While the conductive elements 308 are illustratively chromium, these elements may be tantalum, gold, nickel, aluminum, or titanium or combinations thereof. Moreover, conductive elements 308 may be fabricated from other materials such as conductive metal oxides (e.g. titanium sub-oxide), conductive nitrides or conductive silicides. The choice of materials is also dictated by the chemical reactivity of the materials used for the cladding layer 302 and the core layer 303; and by their suitability as opaque mask elements used in the fabrication of waveguide cores.

Figure 3D:
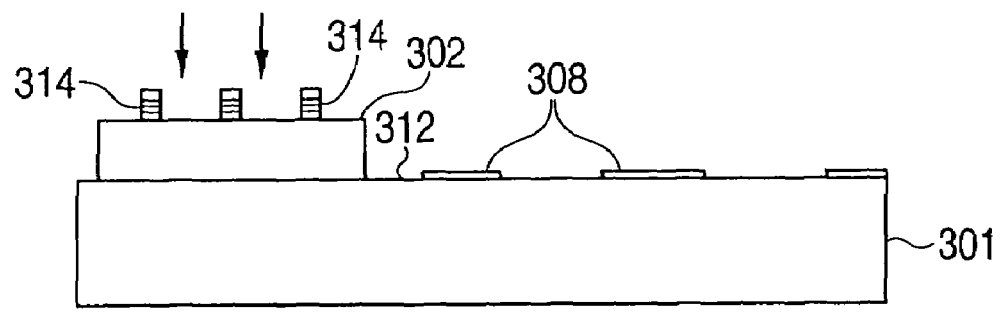
Figure 3E:
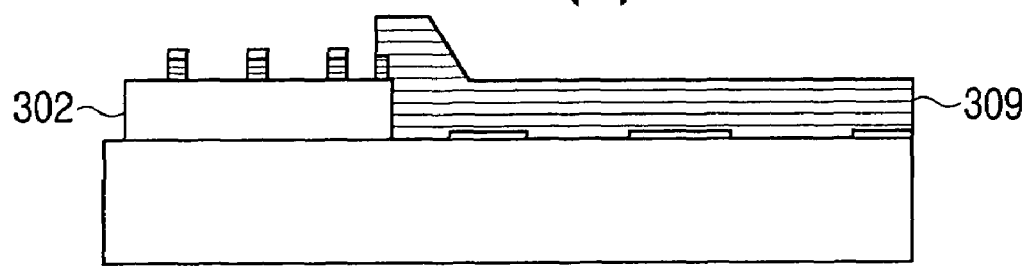

FIG. 3(d) shows an etching step to remove unprotected portions of core layer 303 to form waveguide cores 314. The illustrative etching step may be a reactive-ion-etching step or other standard dry-etching technique. The substrate 301 may be protected during this etch-step by a resist mask 309 shown in FIG. 3(e).

Figure 3F:
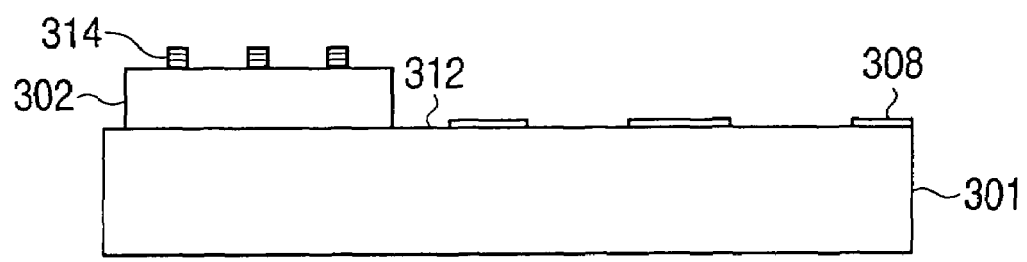

As shown in FIG. 3(f), the elements 308 have been removed from the top surface of waveguide cores 314. This removal step may be effected by a standard technique, and may require a separate masking step.

Figure 3G:
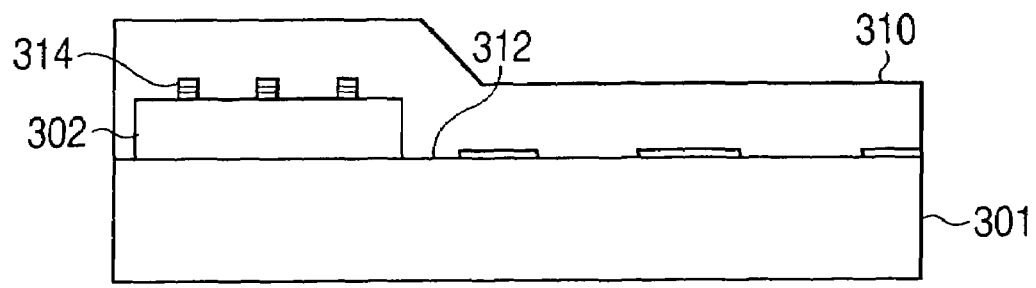

FIG. 3(g) shows the disposition of the optional upper cladding layer 310. However, a waveguide may be formed with lower cladding layer 302, waveguide layer 314 and air above. Upper cladding layer 310 may be formed over the lower cladding layer 302, the waveguide cores 314 and the substrate 301. The upper cladding layer 310 is illustratively of the same material as lower cladding layer 302. The upper cladding layer 310 may be silica, glass, doped glass, polymer or silicon oxynitride. Of course, the lower cladding layer 302 and the upper cladding layer 310 have a lower index of refraction than waveguide cores 314.

Figure 3H:
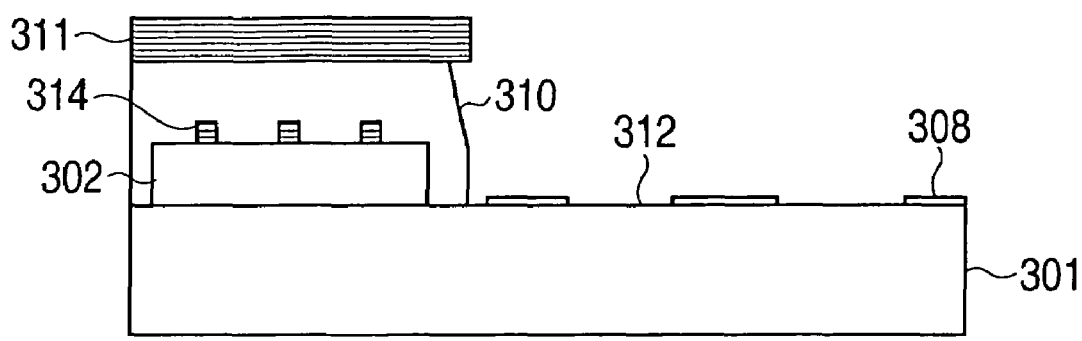

Next, as shown in FIG. 3(h), a resist 311 is disposed over the portion of the upper cladding layer 310 that is over the waveguide cores 314 and lower cladding layer 302. The resist 311 protects the structure thereunder, and the upper cladding layer 310 is selectively removed from the unprotected portion of the substrate 301 and conductive elements 308. The removal of the upper cladding layer 310 may be achieved by a standard dry-etch or wet-etch technique. If removal is by a wet-etch technique, conductive elements 308 may need to be protected with a relatively thin film of protective material (e.g. tantalum oxide in the case of a hydrofluoric acid etch).

Figure 3I:
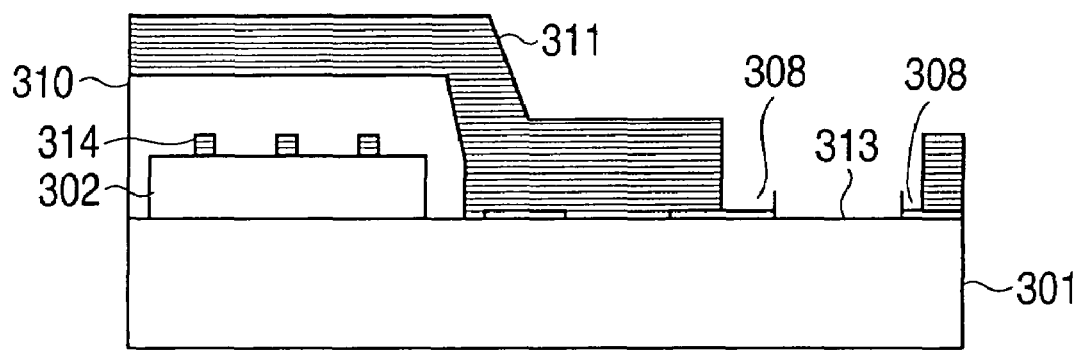

FIG. 3(i) shows the application of a resist 311 over a portion of upper cladding layer 310, core layer 303, lower cladding layer 302 and substrate 301. Exposed portion 313 of the substrate 301 is the region to be selectively etched (micromachined). As can be readily appreciated, the conductive elements 308 in the exposed portion 313 define the area to be selectively etched (i.e. micromachined). The conductive elements 308 used as a mask for the selective etching step are fabricated during the single-mask step described above, and are accurately located and spaced from other features of the multi-level structure. This accuracy ultimately fosters accurate location of recesses, and thereby of elements (e.g. optical fibers) disposed therein.

Figure 3J:
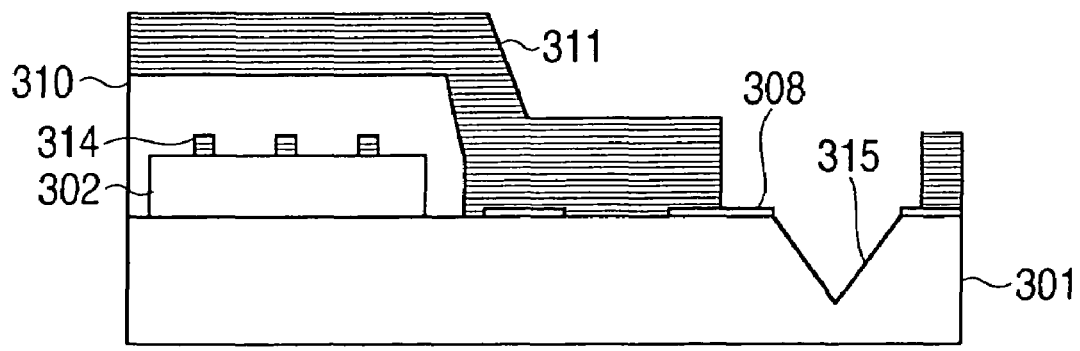

FIG. 3(j) shows the selectively etched recess in the exposed portion 313 defined by the conductive elements 308. The selective etch step may be effected using a standard dry or wet etch techniques.

Figure 3K:
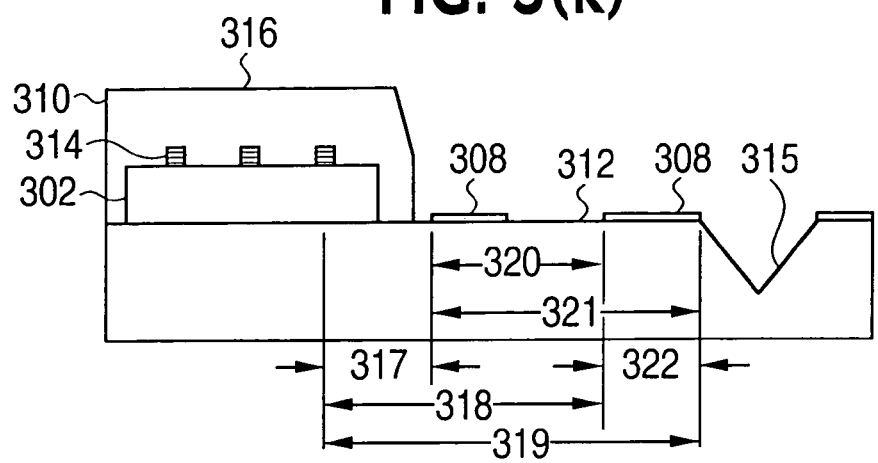

FIG. 3(k) shows the resultant structure after removal of resist 311. As can be readily appreciated, the resultant structure has planar waveguides 316 including upper cladding layer 310, cores 314 and lower cladding layer 302. The planar waveguides 316 are disposed above a baseline level 312 at a first level. The conductive elements 308 are disposed above a baseline level 312 at a second level.

Finally, the recess 315 is disposed below the baseline level 312. Accordingly, a multi-level structure has been formed using a multi-level mask in a single-mask step.

As mentioned above, the formation of conductive elements 308 over the substrate 301 and core layer 303 is accurately defined at multiple levels by virtue of the single-mask step using the multi-level mask 306. Because the conductive elements 308 may be used to fabricate features such as waveguide cores 314 and recess 315, the location of and spacing between these elements is accurately defined. To this end, the relative location of planar waveguides 316, waveguide cores 314, conductive elements 308 and recess 315 is well defined. Illustratively, the horizontal distances 317, 318, 319, 320, 321 and 322, between various features at multiple levels above and below baseline 312 each have an accuracy in the range of approximately ±0.05 µm to less than approximately ±1.0 µm. This degree of accuracy is far greater than that which may be achieved in multi-level structures using conventional lithography techniques.

FIGS. 4(a)-4(g) show an alternative fabrication sequence according to an exemplary embodiment of the present invention. Particularly, the illustrative embodiment shown in FIGS. 4(a)-4(g) demonstrates the applicability of the present invention for use with photosensitive waveguide materials.

Figure 4A:
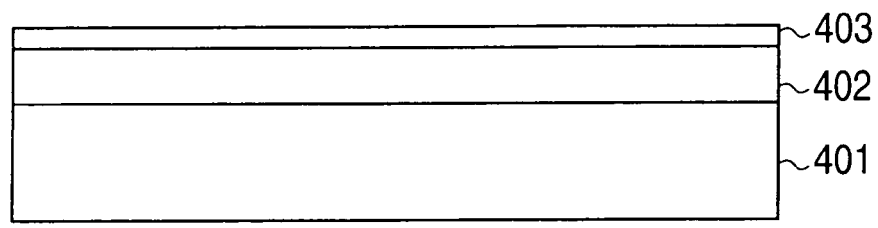
FIGS. 4(*a*)-4(*g*) are cross-sectional views of an illustrative fabrication sequence according to an exemplary embodiment of the present invention.

FIG. 4(a) shows a substrate 401, a lower cladding layer 402 and a core layer 403. The substrate 401 and lower cladding layer 402 are illustratively the same as those described in connection with the exemplary embodiment of FIGS. 3(a)-3(k). However, the core layer 403 is a photosensitive core layer. The core layer 403 may be made from a photosensitive glass or a photosensitive polymer. The core layer 403 and cladding layer 402 each have accurately determined thicknesses. The core layer 403 has a thickness in the range of approximately 2 µm to approximately 5 µm. The lower cladding layer 402 has a thickness in the range of approximately 10 µm to approximately 20 µm.

Figure 4B:
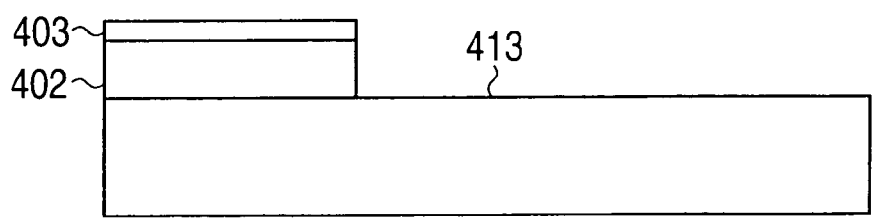

FIG. 4(b) shows the removal of a portion of upper cladding layer 402 and a portion of core layer 403, in areas above baseline level 413 of substrate 401 where there will be no planar waveguides. This removal step may be effected relatively inaccurately (e.g. having an accuracy of ±10 µm to ±50 µm).

Figure 4C:
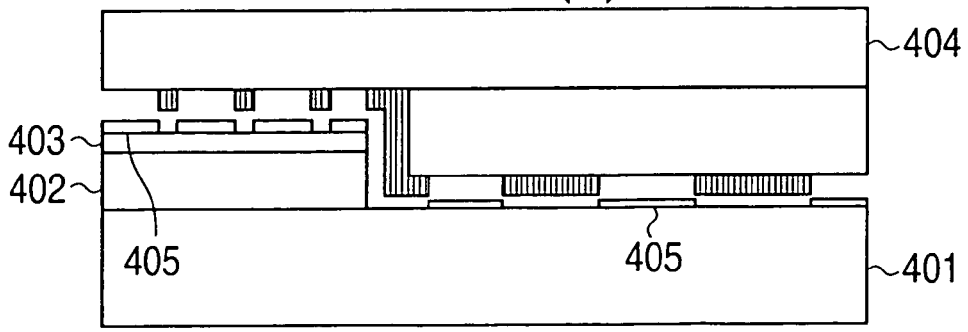
Figure 4D:
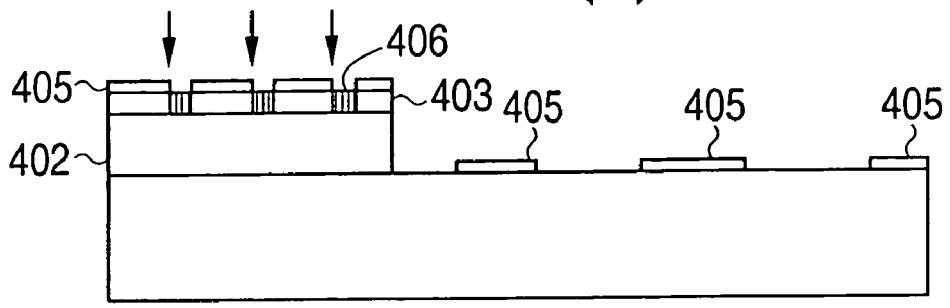
Figure 4E:
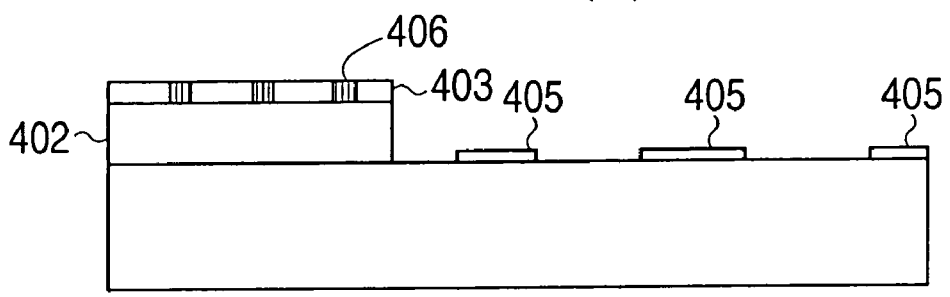

FIG. 4(c) shows a multi-level mask 404 disposed over substrate 401 and core layer 403. The multi-level mask 404 may be used to pattern conductive elements 405 on the substrate 401 and core layer 403. The patterning of the metal layer to form conductive elements 405 may be effected by standard lift-off or undercut etch techniques. As referenced above, the conductive elements 405 may be a variety of metals, or other materials previously described. As can be appreciated from a review of FIG. 4(c), the multi-level mask 404 enables the fabrication of metal elements 405 at multiple levels in a single-mask step. This formation of metal elements 405 in a single-mask step facilitates accurate location of and horizontal distance between features of an OIC or optical bench. Further details of the single-mask step and the advantages thereof may be found above and in the above captioned parent application. p FIG. 4(d) shows exposure of the photosensitive core 403 to form waveguide cores 406. As can be readily appreciated by one having ordinary skill in the art, exposure of core layer 403 to a particular wavelength or wavelength band of radiation results in an increase in the index of refraction of the exposed portion of core layer 403. As such, waveguide cores 406 have an increased index of refraction relative to the lower cladding layer 402 and the unexposed portion of photosensitive core layer 403. FIG. 4(e) shows the removal of mask elements 405 from above photosensitive layer 403. As referenced previously, this removal is by standard technique, and may require a mask step.

Figure 4F:
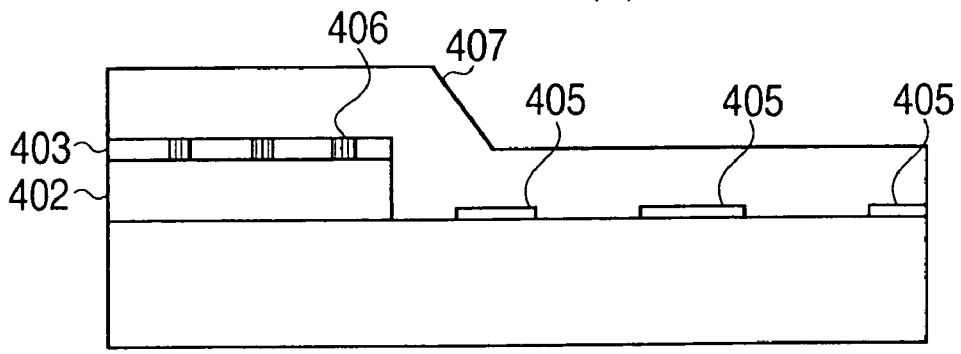
Figure 4G:
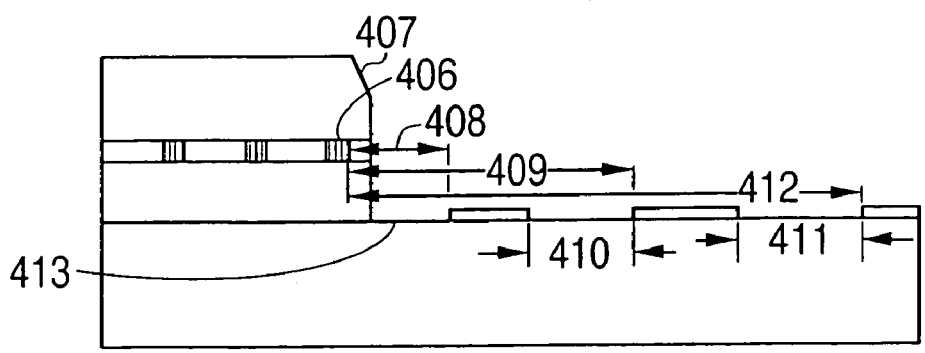

FIGS. 4(f) and 4(g) show the disposition and selective removal of optional upper cladding layer 407. The formation of the upper cladding layer 407 is carried out in a manner identical that described in connection with the illustrative embodiment of FIGS. 3(a)-3(k). Again, this optional and air may form the cladding above waveguide cores 406.

Next, although not shown, the micro-machined features, such as a recess may be carried out using conductive elements 405 disposed over the baseline level 413 of substrate 401. The micro-machined features by selective etching may be effected in a manner identical to that described in connections with the illustrative embodiment of FIGS. 3(a)-3(k).

Finally, as shown in FIG. 4(g), the horizontal distances between and locations of various features formed in the multi-layer structure are very accurately defined. Again, by virtue of the single-mask step, conductive elements 405 may be accurately located and separated from one another at various levels above baseline level 413. These conductive elements are then used as masks in various processing steps described above. Ultimately, the horizontal distances 408, 409, 410, 411 and 412 between features formed at various levels above and below a baseline of substrate 401 are accurately defined. The accuracy of these distances is in the range of approximately ±0.05 µm to less than approximately ±1.0 µm.

Figure 5:
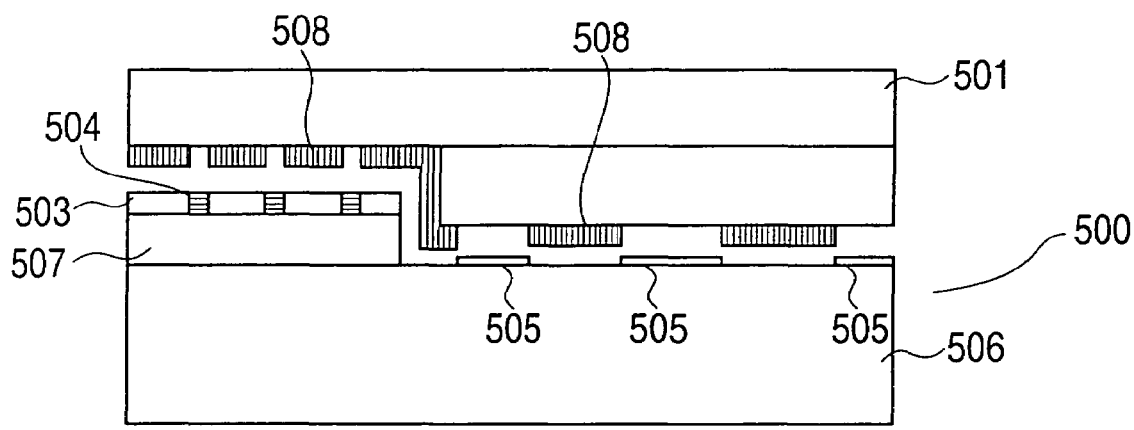
FIG. 5 is a cross-sectional view of an illustrative mask step in accordance with an exemplary embodiment of the present invention.

FIG. 5 shows a cross-sectional view of a multi-layer structure 500 having a multi-level mask 501 disposed thereover. The multi-level mask 501 is as described in the above captioned parent application. The multi-level mask 501 may be used to pattern conductive elements 505 over a substrate 506. The multi-level mask 501 having opaque elements 508 may be used to directly expose a photosensitive core layer 503 disposed over lower cladding layer 507. By using the multi-level mask 501 to form waveguide cores 504, the need for conductive elements 505 over the photosensitive core layer 503 is eliminated. Moreover, the conductive elements 505 may be also formed in the single-mask step used to form the waveguide cores 504. As such, the accuracy of the location of and horizontal distance between various features formed using the single-mask step shown in FIG. 5 are virtually identical to that of the illustrative embodiment shown in FIG. 4(g). The embodiment shown illustratively in FIG. 5 is substantially the same as that shown in FIGS. 4(a)-4(g). Similar processing to that described in connection therewith will result in the fabrication of a structure very similar to that shown in FIG. 4(g).

The invention being thus described, it would be obvious that the same may be varied in many ways by one of ordinary skill in the art having had the benefit of the present disclosure. Such variations are not regarded as a departure from the spirit and scope of the invention, and such modifications as would be obvious to one skilled in the art are intended to be included within the scope of the following claims and their legal equivalents.

We claim:

1. A method of fabricating an optical device, the method comprising: (a) forming at least one feature at a level above a baseline level of a substrate; and (b) forming at least one feature at a level below said baseline level of said substrate, wherein (b) comprises forming a mask over said substrate and selectively etching said substrate, wherein (a) and (b) are patterned in a single-mask step, and wherein an optical device is formed.

2. A method as recited in claim 1, the method further comprising: (c) forming at least one feature at another level above said baseline level of said substrate.

3. A method as recited in claim 2, wherein said at least one feature disposed at said another level is a conductive element.

4. A method as recited in claim 1, wherein (a) comprises patterning a mask over a core layer, and selectively removing portions of said core layer.

5. A method as recited in claim 4, wherein said core layer is disposed over a lower cladding layer.

6. A method as recited in claim 5, further comprising forming an upper cladding layer over at least one waveguide core.

7. A method as recited in claim 1, wherein said feature disposed at a level above said baseline level is a planar waveguide.

8. A method as recited in claim 1, wherein said feature at said level below said baseline level is a groove.

9. A method as recited in claim 1, wherein the single mask step comprises contact printing.

10. A method as recited in claim 1, wherein the at least one feature at a level above a baseline level comprises a waveguide core of a planar waveguide.

11. A method as recited in claim 1, wherein the at least one feature at a level below said baseline level comprises a recess for holding an optical element.

12. A method as recited in claim 11, wherein the recess for holding an optical element is a groove for holding an optical fiber.

13. A method as recited in claim 12, wherein the groove is a v-groove.

14. A method as recited in claim 12, further comprising disposing an optical fiber in the groove.

15. A method as recited in claim 12, further comprising disposing a lens in the pit.

16. A method as recited in claim 11, wherein the recess for holding an optical element is a pit for holding a lens.

17. A method of fabricating an optical device, the method comprising: forming a lower cladding layer at a level above a baseline level of a substrate; forming a core layer over said lower cladding layer; forming opaque elements over said core layer and over said substrate at another level above said baseline level of said substrate in a single-mask step; and selectively removing a portion of said core layer to form at least one waveguide core.

18. A method as recited in claim 17, wherein said core layer is a photosensitive material.

19. A method as recited in claim 17, wherein said opaque elements at said another level are conductive elements.

20. A method as recited in claim 17, the method further comprising: forming a recess at a level below said baseline level of said substrate.

21. A method as recited in claim 17, wherein an upper cladding layer is disposed over said at least one waveguide core.

22. A method as recited in claim 17, wherein said waveguide core is doped.

23. A method as recited in claim 17, wherein the single mask step comprises contact printing.

24. A method as recited in claim 17, further comprising selectively removing a portion of the substrate to form at least one feature at a level below said baseline level.

25. A method as recited in claim 24, wherein the at least one feature at a level below said baseline level comprises a recess for holding an optical element.

26. A method as recited in claim 25, wherein the recess for holding an optical element is a groove for holding an optical fiber.

27. A method as recited in claim 26, wherein the groove is a v-groove.

28. A method as recited in claim 26, further comprising disposing an optical fiber in the groove.

29. A method as recited in claim 25, wherein the recess for holding an optical element is a pit for holding a lens.

30. A method as recited in claim 29, further comprising disposing a lens in the pit.

* * * * *